(12) United States Patent
Yokoyama

(10) Patent No.: US 9,437,527 B2
(45) Date of Patent: Sep. 6, 2016

(54) METHOD FOR MANUFACTURING ELECTRICAL CONNECTIONS IN A SEMICONDUCTOR DEVICE AND THE SEMICONDUCTOR DEVICE

(71) Applicant: FUJI ELECTRIC CO., LTD., Kawasaki-shi (JP)

(72) Inventor: Takeshi Yokoyama, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/630,171

(22) Filed: Feb. 24, 2015

(65) Prior Publication Data

US 2015/0279752 A1 Oct. 1, 2015

(30) Foreign Application Priority Data

Apr. 1, 2014 (JP) ................................ 2014-075581
Jul. 17, 2014 (JP) ................................ 2014-147096

(51) Int. Cl.
*H01L 23/495* (2006.01)
*H01L 23/02* (2006.01)
*H01L 23/48* (2006.01)
(Continued)

(52) U.S. Cl.
CPC ....... *H01L 23/49541* (2013.01); *H01L 23/057* (2013.01); *H01L 24/49* (2013.01); *H01L 24/83* (2013.01); *H01L 24/85* (2013.01); *H01L 2224/32225* (2013.01); *H01L 2224/451* (2013.01); *H01L 2224/48091* (2013.01); *H01L 2224/48101* (2013.01); *H01L 2224/48106* (2013.01); *H01L 2224/48247* (2013.01);
(Continued)

(58) Field of Classification Search
CPC ........... H01L 23/49541; H01L 23/057; H01L 24/49; H01L 24/83; H01L 24/85; H01L 2224/49175; H01L 2924/19107; H01L 2924/181; H01L 2224/451; H01L 2924/00014; H01L 2224/32225; H01L 2224/8385; H01L 2224/48247; H01L 2224/48106; H01L 2224/85801; H01L 2224/48101; H01L 2224/48091; H01L 2224/45099; H01L 2924/00
USPC ......................... 257/676, 680, 690, 711, 787
See application file for complete search history.

(56) References Cited

U.S. PATENT DOCUMENTS

2014/0084436 A1* 3/2014 Funatsu ................. H01L 24/40
257/676
2015/0145112 A1* 5/2015 Otremba ........... H01L 23/49541
257/676

FOREIGN PATENT DOCUMENTS

JP H11-330344 A 11/1999
JP 2001-018252 A 1/2001

*Primary Examiner* — A. Sefer
*Assistant Examiner* — Dilinh Nguyen
(74) *Attorney, Agent, or Firm* — Rabin & Berdo, P.C.

(57) ABSTRACT

A resin casing is insert-molded while clamp protrusions of clamp portions formed in bonding portions of lead terminals are put between an upper mold and a lower mold. An insulating substrate which has a wiring pattern mounted with semiconductor elements is fitted into an opening portion of the resin casing and adhesively bonded to the resin casing. Electric connection between the semiconductor elements and the bonding portions of the lead terminals and between the wiring pattern on the insulating substrate and the bonding portions of the lead terminals is made by bonding wires. Thus, it is possible to provide a method for manufacturing a semiconductor device and the semiconductor device, in which stress applied to lead terminals of a lead frame formed by insert molding can be suppressed, and wire bonding properties and reliability can be improved even when the thickness of each of the lead terminals is reduced.

12 Claims, 16 Drawing Sheets

(51) Int. Cl.
*H01L 23/52* (2006.01)
*H01L 23/12* (2006.01)
*H01L 23/28* (2006.01)
*H01L 23/00* (2006.01)
*H01L 23/057* (2006.01)

(52) U.S. Cl.
CPC ............... *H01L2224/49175* (2013.01); *H01L 2224/8385* (2013.01); *H01L 2224/85801* (2013.01); *H01L 2924/00014* (2013.01); *H01L 2924/181* (2013.01); *H01L 2924/19107* (2013.01)

METHOD FOR MANUFACTURING ELECTRICAL CONNECTIONS IN A SEMICONDUCTOR DEVICE AND THE SEMICONDUCTOR DEVICE

CROSS-REFERENCE TO RELATED APPLICATIONS

This application is based on, and claims priority to, Japanese Patent Application No. 2014-075581, filed on Apr. 1, 2014, and Japanese Patent Application No. 2014-147096, filed on Jul. 17, 2014. The contents of the identified applications are entirely incorporated herein by reference.

BACKGROUND OF THE INVENTION

1. Field of the Invention

The present invention relates to a method for manufacturing a semiconductor device and the semiconductor device, in which an insulating substrate mounted with semiconductor elements and other electronic components is received inside a resin casing formed integrally with a lead frame by insert molding.

2. Description of the Background Art

For example, a background-art example shown in FIG. 3 of JP-A-11-330344 has been known as this kind of semiconductor device.

In FIG. 3 of JP-A-11-330344, each of tips of lower ends of external lead-out terminals to which bonding wires will be connected on a lead frame is bent into an L shape to form a horizontal portion, and insert molding is carried out so that the horizontal portion can protrude into an annular insulating casing. Of the horizontal portions of the external lead-out terminals protruding into the annular insulating casing, unnecessary parts are cut off after the insert molding.

In JP-A-2001-18252, a resin is injected in a state in which fixation pins for vertical regulation are disposed inside a mold to fix a lower surface of a lead frame, and molding is performed with the semi-melted resin while the fixation pins are retreated from the surface of the lead frame.

However, in JP-A-11-330344, the unnecessary parts of the external lead-out terminals are cut off after the insert molding. For this reason, stress is applied to the external lead-out terminals during the cutting so that there is a fear that portions of the external lead-out terminals to which bonding wires will be connected may be deformed as the thickness of each of the lead terminals is reduced. In addition, there is a fear that a gap may be generated between the external lead-out terminals and a resin layer of the insulating casing due to the stress applied during the cutting. Thus, there is a problem that wire bonding properties may be lowered to affect reliability of the semiconductor device, such as vibration test resistance, heat cycle resistance, etc. when bonding wires are bonded to the external lead-out terminals.

In addition, JP-A-2001-18252 has a problem that the places in which the lead frame is fixed by the fixation pins may be deformed as the thickness of each of the lead terminals is reduced, and wire bonding properties maybe lowered to affect reliability of the semiconductor device, such as vibration test resistance, heat cycle resistance, etc.

SUMMARY OF THE INVENTION

The invention is to provide a method for manufacturing a semiconductor device and the semiconductor device, in which stress applied to lead terminals of a lead frame formed by insert molding can be suppressed, and wire bonding properties and reliability can be improved even when the thickness of each of the lead terminals is reduced.

In order to achieve the foregoing object, according to an aspect of the invention as to a method for manufacturing a semiconductor device, there is provided a method for manufacturing a semiconductor device including a semiconductor element received in an annular resin casing which has an opening portion and which is molded integrally with lead terminals by insert molding using at least two molds, the method including: an insert molding step of placing clamp portions, which have clamp protrusions and which are formed in bonding portions of the lead terminals, on one of the molds to protrude the clamp portions into the opening portion, and insert-molding the resin casing while putting the clamp protrusions between the one mold and the other mold; a substrate mounting step of fitting an insulating substrate, which has a wiring pattern mounted with the semiconductor element, into the opening portion of the insert-molded resin casing and adhesively bonding the insulating substrate and the resin casing to each other; and a wire bonding step of making electric connection between the semiconductor element and one of the bonding portions of the lead terminals and/or between the wiring pattern on the insulating substrate and the other of the bonding portions of the lead terminals by bonding wires.

In addition, according to an aspect of the invention as to the semiconductor device, there is provided a semiconductor device including a semiconductor element received in an annular resin casing which has an opening portion and which is molded integrally with lead terminals by insert molding, the semiconductor device including: the lead terminals each of which is provided with a bonding portion and a terminal portion; the resin casing which is formed by insert molding while the clamp portions having clamp protrusions formed in the bonding portions of the lead terminals are put between molds opposed to each other in a state in which the clamp portions are protruded into the opening portion; an insulating substrate which has a wiring pattern mounted with the semiconductor element disposed in the opening portion; and bonding wires which make electric connection between the semiconductor element and one of the bonding portions of the lead terminals and between the wiring pattern on the insulating substrate and the other of the bonding portions of the lead terminals; wherein: the clamp portions are provided with notch portions.

The invention can provide a method for manufacturing a semiconductor device and the semiconductor device, in which stress applied to lead terminals of a lead frame formed by insert molding can be suppressed, and wire bonding properties and reliability can be improved even when the thickness of each of the lead terminals is reduced.

DETAILED DESCRIPTION OF THE INVENTION

Embodiments of the invention will be described below with reference to the drawings.

Embodiment 1

A semiconductor device according to an embodiment of the invention will be described.

Figure 1A:
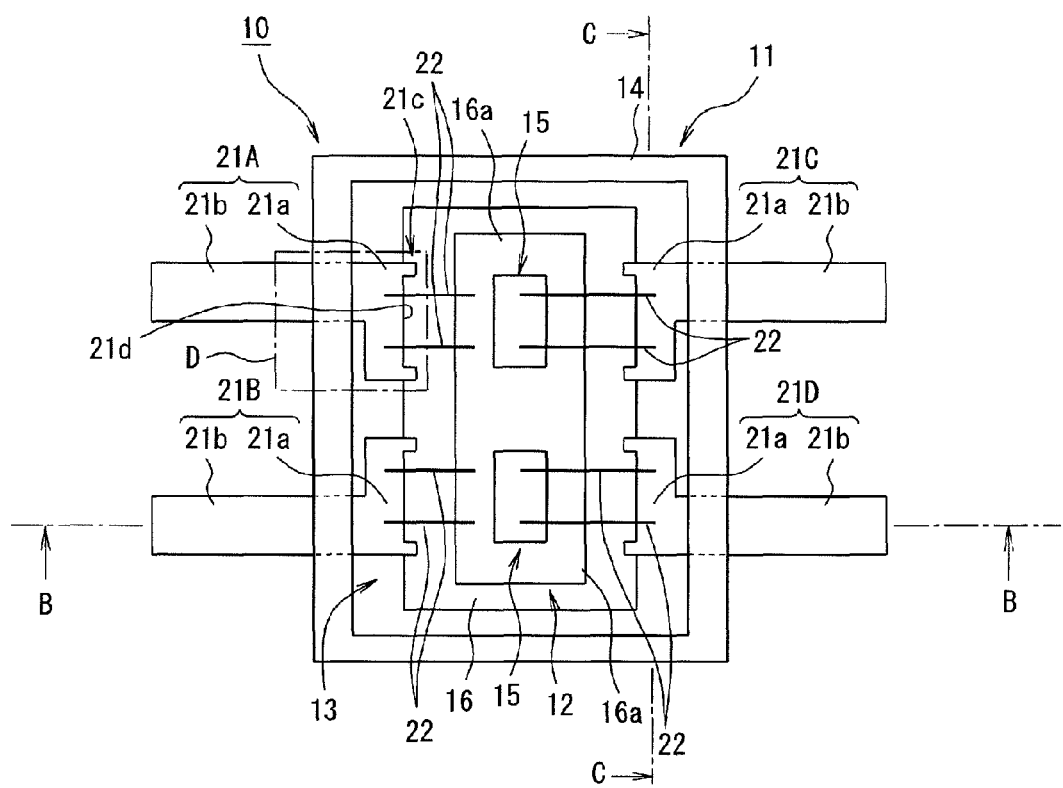
FIGS. 1A, 1B and 1C are a plan view of a semiconductor device according to an embodiment of the invention, a sectional view taken along the line B-B of FIG. 1A, and a sectional line taken along the line C-C of FIG. 1A, respectively.
Figure 1B:
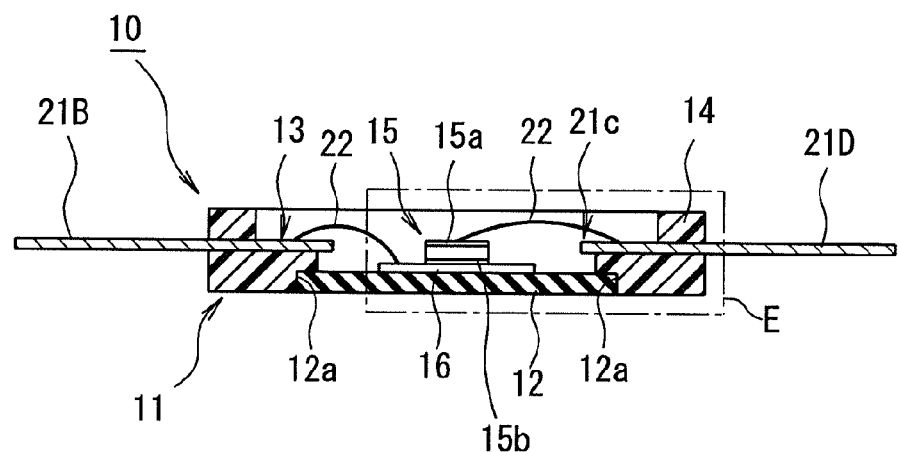
Figure 1C:
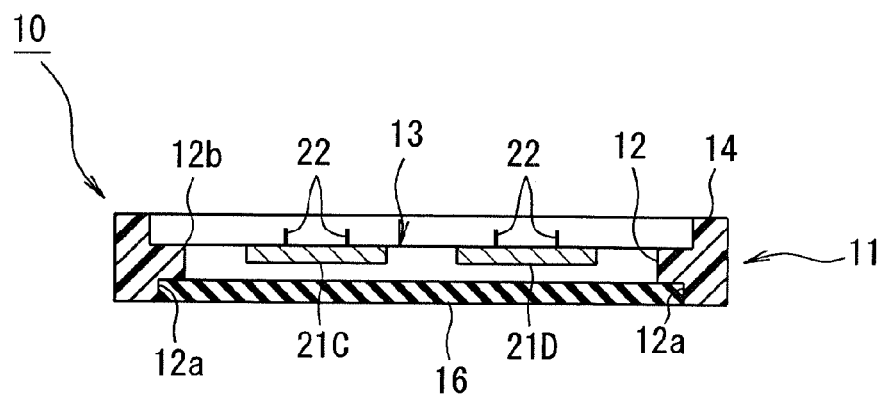
Figure 2:
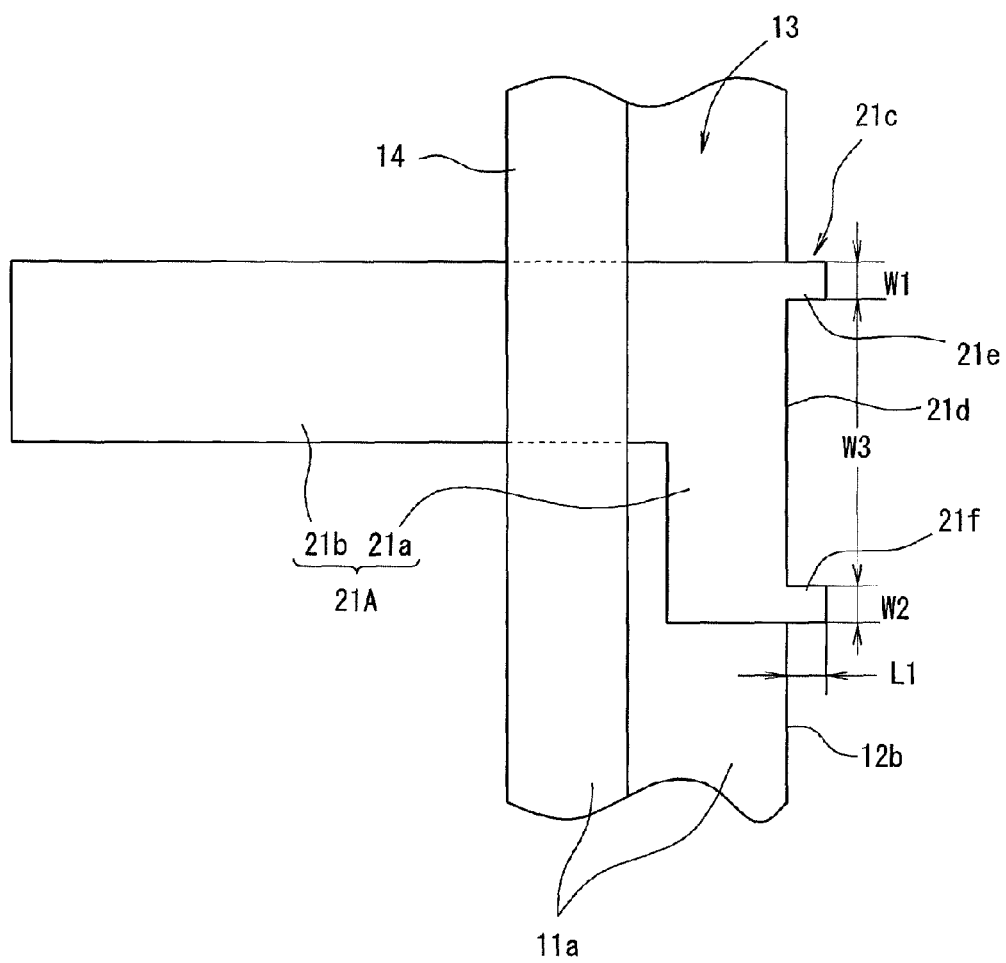
FIG. 2 is an enlarged view of a portion D of FIG. 1A according to the embodiment of the invention.
Figure 3:
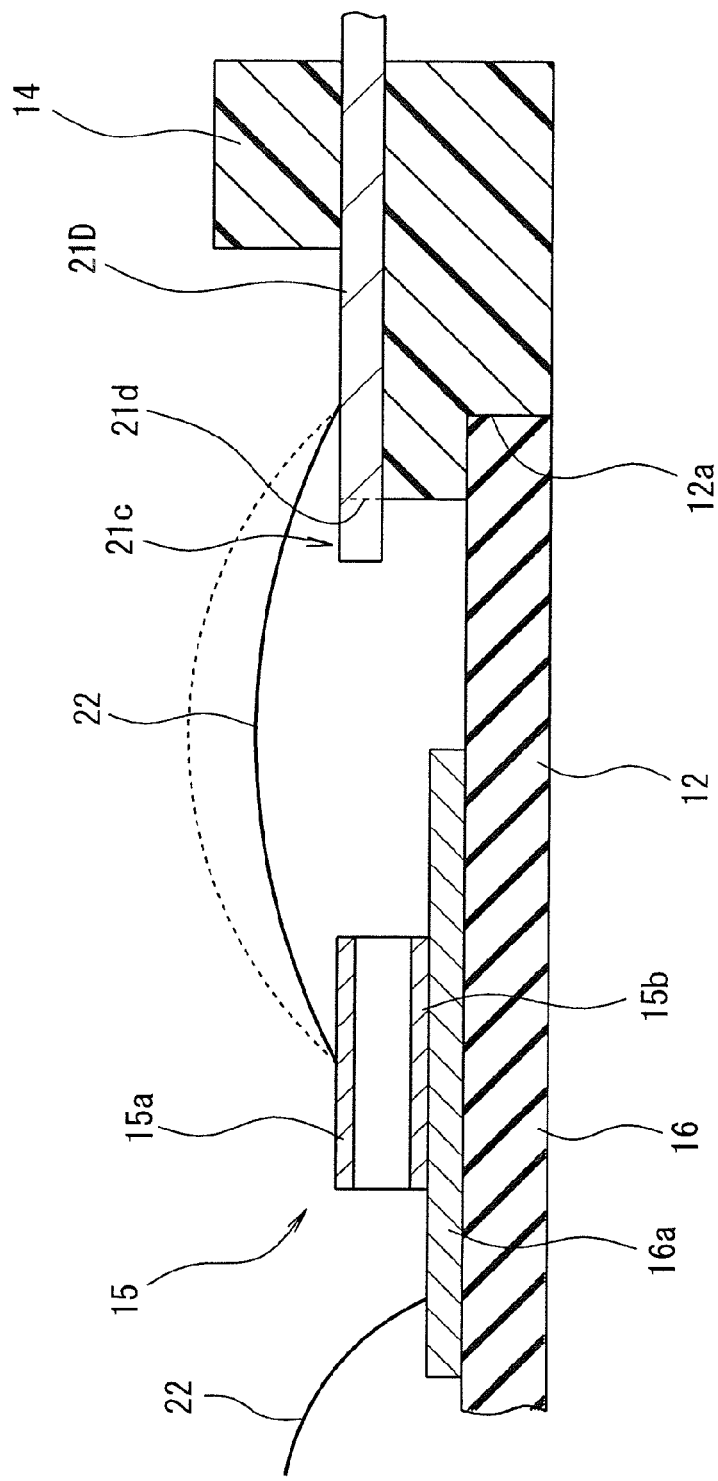
FIG. 3 is an enlarged view of a portion E of FIG. 1B according to the embodiment of the invention.
Figure 4A:
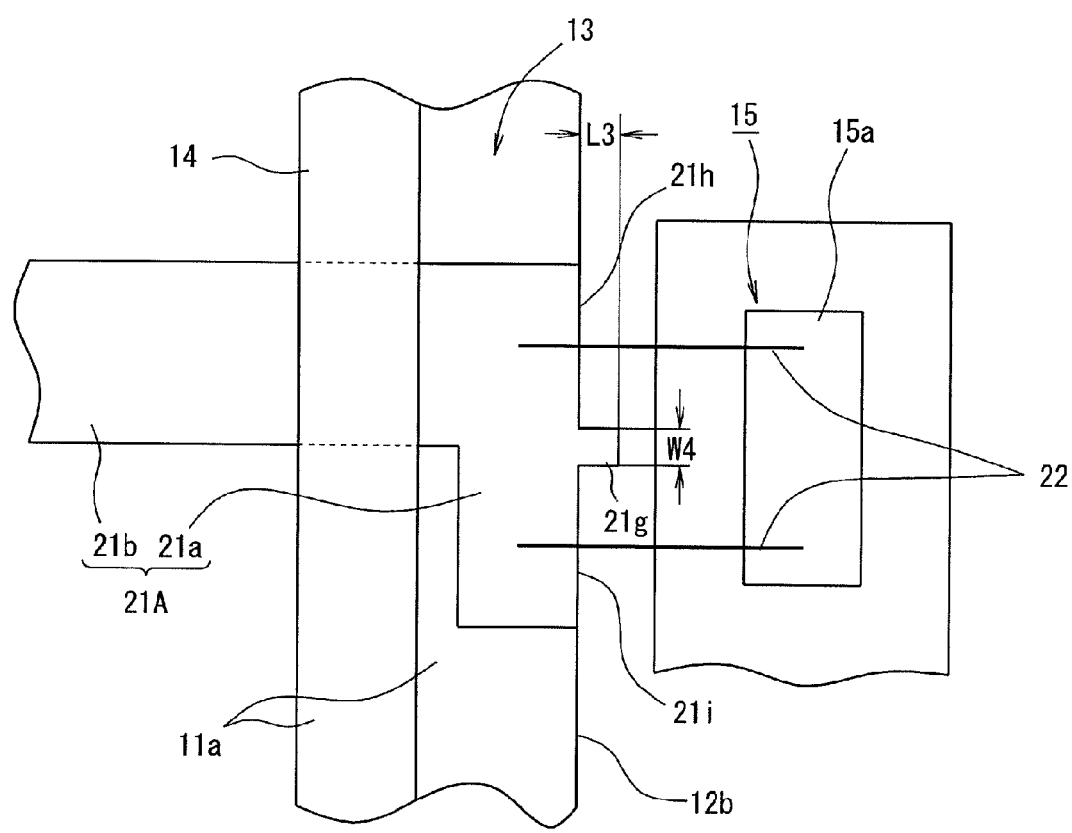
FIGS. 4A and 4B are enlarged views of portions D corresponding to FIG. 1A according to the embodiment of the invention.
Figure 4B:
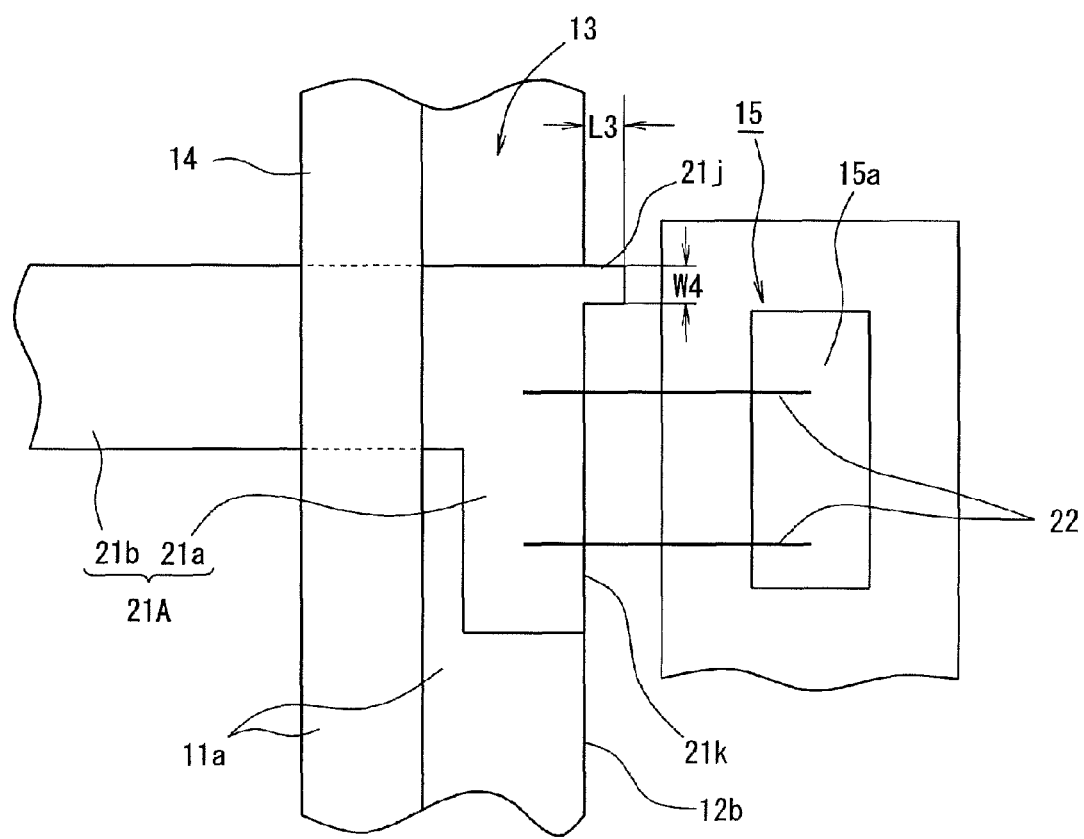

FIGS. 1A to 1C, FIG. 2, FIG. 3 and FIGS. 4A and 4B show a plan view of the embodiment of the invention, and sectional views and enlarged views thereof. FIG. 1A shows a plan view. FIG. 1B shows a sectional view taken along the line B-B of FIG. 1A. FIG. 1C shows a sectional view taken along the line C-C of FIG. 1A. FIG. 2 shows an enlarged view of a portion D of FIG. 1A. FIG. 3 shows an enlarged view of a portion E of FIG. 1B. FIGS. 4A and 4B show enlarged views of portions D corresponding to FIG. 1A.

As shown in FIG. 1A, a semiconductor device 10 has an annular resin casing 11 which has an opening portion 12 formed in its center portion and which is formed integrally with lead terminals 21A to 21D by insert molding. An insulating substrate 16 is fitted into the resin casing 11. Semiconductor elements 15 are mounted on a wiring pattern 16a formed on the insulating substrate 16. The semiconductor elements 15, the wiring pattern 16a and the lead terminals 21A to 21D are electrically connected by bonding wires 22.

As shown in FIG. 1B, a lead terminal insertion face 13 is formed above the opening portion 12 of the resin casing 11. A rectangular frame-like portion 14 protruding upward is formed on an outer peripheral side of the lead terminal insertion face 13.

A notch portion 12a is formed on a lower surface side of the opening portion 12. The insulating substrate 16 mounted with the semiconductor elements 15 is fitted into the notch portion 12a. The insulating substrate 16 and the resin casing 11 are adhesively bonded to each other by an adhesive agent.

Incidentally, electronic components such as resistors, capacitors etc. besides the semiconductor elements 15 may be mounted on the wiring pattern 16a on the insulating substrate 16. The wiring pattern 16a is formed in accordance with an intended purpose.

As shown in FIG. 1A, for example, the four lead terminals 21A to 21D are formed integrally with the resin casing by insert molding, for example, in left/right and front/rear symmetric positions in the lead terminal insertion face 13.

Each of the lead terminals 21A to 21D is provided with a bonding portion 21a to which bonding wires 22 are bonded, and a terminal portion 21b which is coupled to the bonding portion 21a. Each of the lead terminals 21A to 21D is formed into an L shape. Here, each of the lead terminals 21A to 21D is disposed so that the bonding portion 21a is located on the opening portion 12 side. The terminal portion 21b penetrates the rectangular frame-like portion 14 and extends to the outside of the resin casing 11.

Incidentally, the lead terminals 21A to 21D are not limited to the left/right and front/rear symmetric positions. The left/right and front/rear positions of the lead terminals 21A to 21D may be changed if occasion demands. In addition, each of the lead terminals 21A to 21D does not have to always penetrate the rectangular frame-like portion 14 in the left/right direction but may be bent into an L shape inside the rectangular frame-like portion 14 and protruded outward from an upper surface of the rectangular frame-like portion 14.

As shown in FIG. 1C, each of the lead terminals 21A to 21D is embedded to be leveled with the lead terminal insertion face 13 in the state in which an upper surface of each of the lead terminals 21A to 21D is exposed in the lead terminal insertion face 13.

As shown in FIG. 2, each of the lead terminals 21A to 21D has a clamp portion 21c formed in an end portion of the bonding portion 21a on the opening portion 12 side. The clamp portion 21c protrudes into the opening portion 12.

In addition, when the clamp portion 21c protrudes into the opening portion 12 as shown in FIG. 3, it is necessary to increase the height of the bonding wire 22 as illustrated by the broken line in FIG. 3 in order to secure an insulation distance between the bonding wire 22 and the lead terminal 21A-21D.

Therefore, as shown in FIG. 2, a concave notch portion 21d is formed in the center portion of the clamp portion 21c above which the bonding wire 22 will pass. The notch portion 21d extends from a front end surface of the clamp portion 21c and reaches a wall surface of the opening portion 12. The clamp portion 21c protrudes into the opening portion 12 of the resin casing 11. It is desirable that the end surface of the bottom portion of the concave notch portion 21d is on the same plane as an end edge 12b of the opening portion 12 of the resin casing 11.

With the provision of the concave notch portion 21d in the clamp portion 21c, an insulation distance can be secured between the bonding portion 21a of each of the lead terminals 21A to 21D and each of the bonding wires 22 connected thereto.

Thus, the position where the bonding wire 22 passes as illustrated by the solid line in FIG. 3 can be lowered due to the formation of the concave notch portion 21d so that the height of the semiconductor device 10 can be reduced.

When the concave notch portion 21d is formed in the center portion of the clamp portion 21c, a protrusion length L1 of the clamp portion 21c is set to be not smaller than a thickness t (for example, 0.5 mm) of each of the lead terminals 21A to 21D in order to surely perform clamping using a lower mold 41 and an upper mold 42 for insert molding which will be described later.

Widths W1 and W2 of clamp protrusions 21e and 21f of left and right side edge portions forming the concave notch portion 21d are also set to be not smaller than the thickness t of each of the lead terminals 21A to 21D for the same reason. Further, a width W3 of the concave notch portion 21d is also set to be a length which is not smaller than the thickness t of each of the lead terminals 21A to 21D and with which a necessary insulation distance for the bonding wire 22 can be secured.

Electrodes 15a formed in upper surfaces of the semiconductor elements 15 are electrically connected to the bonding portions 21a of the lead terminals 21C and 21D by bonding wires 22 respectively. Electrodes 15b formed in lower surfaces of the semiconductor elements 15 are electrically connected to the wiring pattern 16a on the insulating substrate 16 by not-shown solder or by a conductive adhesive agent. The wiring pattern 16a is electrically connected to the lead terminals 21A and 21B by the bonding wires 22 respectively.

Although the aforementioned embodiment has been described in the case where each of the lead terminals 21A to 21D is formed into an L shape, the shape of each of the lead terminals 21A to 21D is not limited thereto but may be formed as a linear shape or as a T shape or maybe formed as any desired shape.

The embodiment of the invention has been described in the case where the concave notch portions 21d are formed in the center portions of the clamp portions 21c of the lead terminals 21A to 21D and the clamp protrusions 21e and 21f are formed on the opposite sides of each of the concave notch portions 21d as shown in FIG. 2. However, the invention is not limited to the aforementioned configuration.

As shown in FIG. 4A, notch portions 21h and 21i may be formed in opposite end surfaces of the bonding portion 21a of each of the lead terminals 21A to 21D parallel to a perpendicular direction to an inner end surface of the opening portion 12 of the resin casing 11 and a convex clamp protrusion 21g may be provided in the center portion of the bonding portion 21a in the case where the bonding wires 22 pass above the opposite end surfaces of the bonding portion 21a parallel to the perpendicular direction to the inner end surface of the opening portion 12 of the resin casing 11.

In addition, as shown in FIG. 4B, a notch portion 21k may be formed in one end surface of the bonding portion 21a of each of the lead terminals 21A to 21D above which the bonding wires 22 pass and a clamp protrusion 21j may be provided in the other end surface of the bonding portion 21a in the case where the bonding wires 22 pass above the one end surface of the bonding portion 21a parallel to the perpendicular direction to the inner end surface of the opening portion 12 of the resin casing 11.

On this occasion, a protrusion length L3 and a width W4 of the clamp protrusion 21g (or 21j) are set to be not smaller than the thickness t of each of the lead terminals 21A to 21D. Thus, clamping using the lower mold 41 and the upper mold 42 for insert molding which will be described later can be performed surely.

Incidentally, the number of bonding wires 22 may be one. The number of bonding wires to be bonded is set in accordance with the necessity such as a withstand voltage, an intended purpose of the semiconductor device, etc.

In addition, the opening portion 12, the lead terminal insertion face 13 and the rectangular frame-like portion 14 of the resin casing 11 are resin-sealed with a not-shown insulation resin such as an epoxy-based casting resin, a gel sealing agent, or the like.

Embodiment 2

A method for manufacturing the semiconductor device according to an embodiment of the invention will be described.

Figure 5:
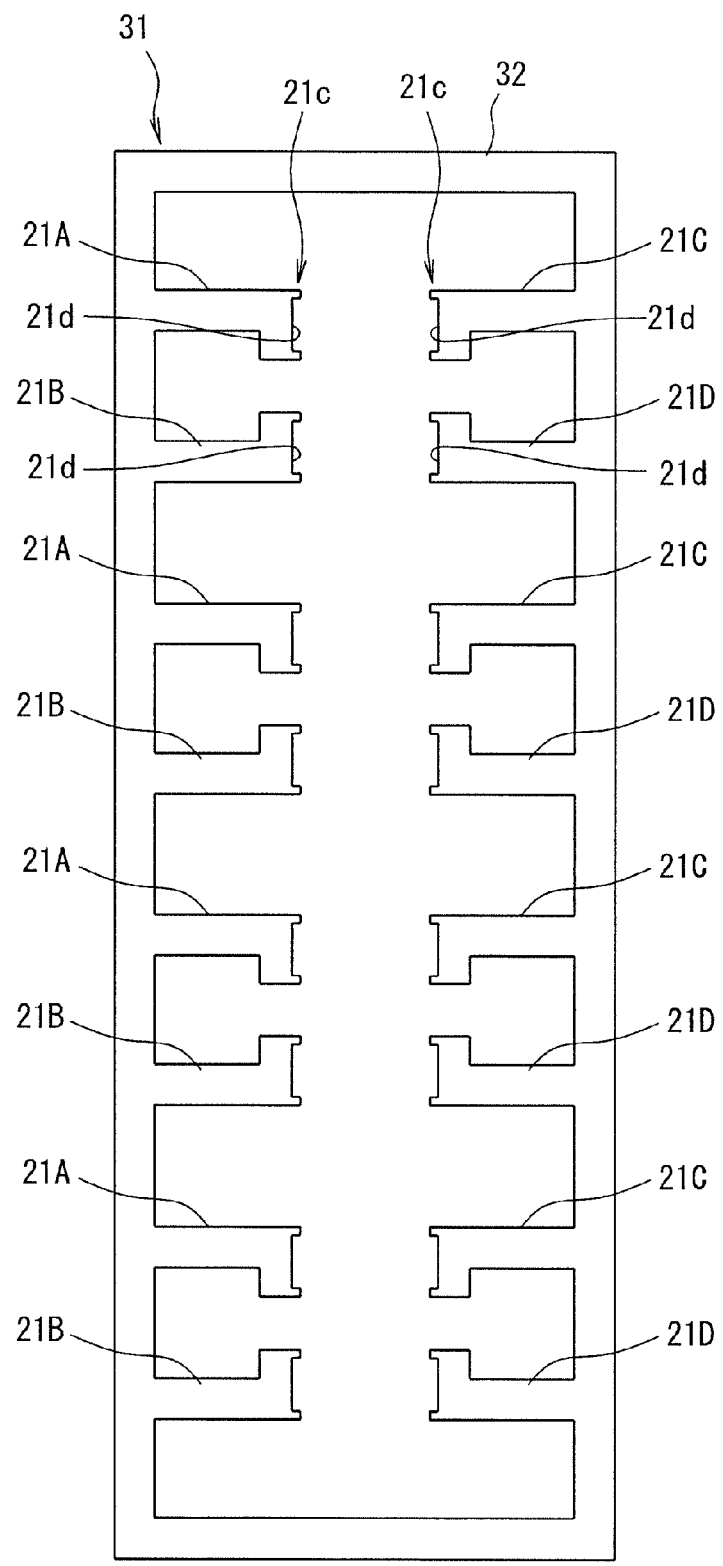
FIG. 5 is a plan view showing a lead frame according to an embodiment of the invention.

FIG. 5 shows a plan view of a lead frame 31. The lead frame 31 is formed integrally, for example, with four lead terminals 21A to 21D so that the lead terminals 21A to 21D can protrude inward from an inner peripheral surface of a rectangular frame-like tie-bar 32.

Each of the lead terminals 21A to 21D is provided with a bonding portion 21a to which bonding wires 22 are bonded and a terminal portion 21b which is coupled to the bonding portion 21a, as described above. The terminal portion 21b is coupled to the tie-bar 32.

A clamp portion 21c provided with a concave notch portion 21d as shown in FIG. 2 is formed in each of the bonding portions 21a of the lead terminals 21A to 21D.

Figure 6:
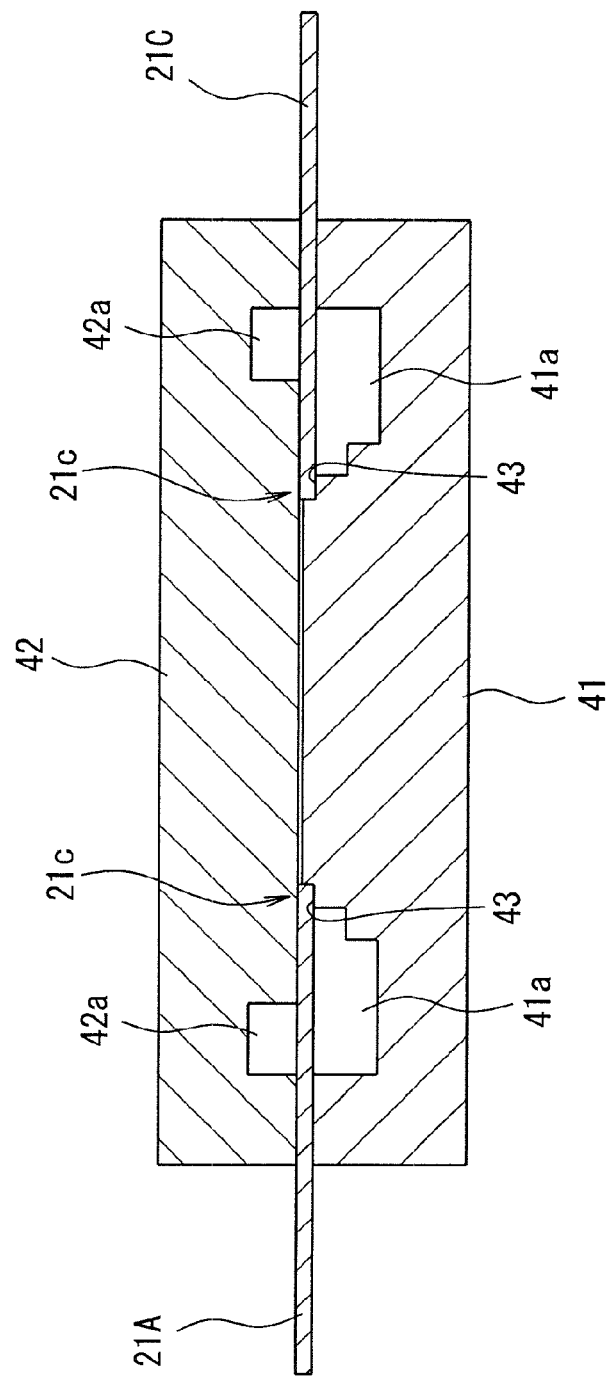
FIG. 6 is a sectional view showing molds for insert molding according to the embodiment of the invention.

FIG. 6 shows a sectional view of molds for insert molding. As shown in FIG. 6, a lead frame 31 is set in the lower mold 41 performing insert molding. The lower mold 41 is provided with grooves 43 into which clamp protrusions 21e and 21f of the clamp portions 21c provided with the notch portions 21d can be fitted. After the lead frame 31 is set in the lower mold 41, an upper mold 42 is moved down. Thus, the lead frame 31 is fixed when the clamp protrusions 21e and 21f of the clamp portions 21c of the lead terminals 21A to 21D are put between the lower mold 41 and the upper mold 42.

Incidentally, the grooves 43 may be formed not in the lower mold 41 but in the upper mold 42.

Then, a resin material which is composed of polyphenylene sulfide (PPS), polybutylene succinate (PBT) etc. and which has been melted by heat is injected into cavities 41a and 42a with predetermined pressure and solidified. The cavities 41a and 42a are formed in the lower mold 41 and the upper mold 42.

The clamp portions 21c provided with the clamp protrusions 21e and 21f formed due to the concave notch portions 21d of the lead terminals 21A to 21D of the lead frame 31 are put between the upper mold 42 and the lower mold 41 which is provided with the grooves 43 into which the clamp protrusions 21e and 21f of the clamp portions 21c are fitted. In this manner, the lead terminals 21A to 21D can be fixed in accurate positions. The lead terminals 21A to 21D can be prevented from floating from a resin layer 11a of the resin casing 11 so that no gap is generated between the lead terminals 21A to 21D and the resin layer 11a. Thus, accurate insert molding can be performed.

In addition, as shown in FIG. 2, in the shape of the clamp portion 21c provided with the concave notch portion 21d, the protrusion length L1 of each of the clamp protrusions 21e and 21f of the clamp portion 21c is set to be not smaller than the thickness t (for example, 0.5 mm) of each of the lead terminals 21A to 21D in order to surely perform clamping using the lower mold 41 and the upper mold 42 for insert molding. The widths W1 and W2 of the clamp protrusions 21e and 21f of the left and right side edge portions forming the concave notch portion 21d are also set to be not smaller than the thickness t of each of the lead terminals 21A to 21D for the same reason. Further, the width W3 of the concave notch portion 21d is also set to be a length which is not smaller than the thickness t of each of the lead terminals 21A to 21D and with which a necessary insulation distance for the bonding wire 22 can be secured.

Even if the thickness t of each of the lead terminals 21A to 21D is not larger than 0.5 mm, the clamp portion 21c including the concave notch portion 21d with the aforementioned dimensions is provided in each of the lead terminals 21A to 21D so that the lead terminals 21A to 21D can be fixed in accurate positions. Thus, it is possible to form the resin casing 11 in which the bonding portions 21a of the lead terminals 21A to 21D are not deformed.

Further, since it is not necessary to use fixation pins for fixing the lead frame 31 to the mold, deformation of the bonding portions 21a of the lead terminals 21A to 21D formed by insert molding can be suppressed.

Since deformation of the bonding portions 21a of the resin casing 11 formed by insert molding can be suppressed, the bonding wires 22 can be firmly bonded to the bonding portions 21a without separation. Accordingly, it is possible to mold the resin casing 11 with excellent wire bonding properties. Thus, it is possible to improve reliability of the semiconductor device 10 such as vibration test resistance, heat cycle resistance, etc.

Figure 7:
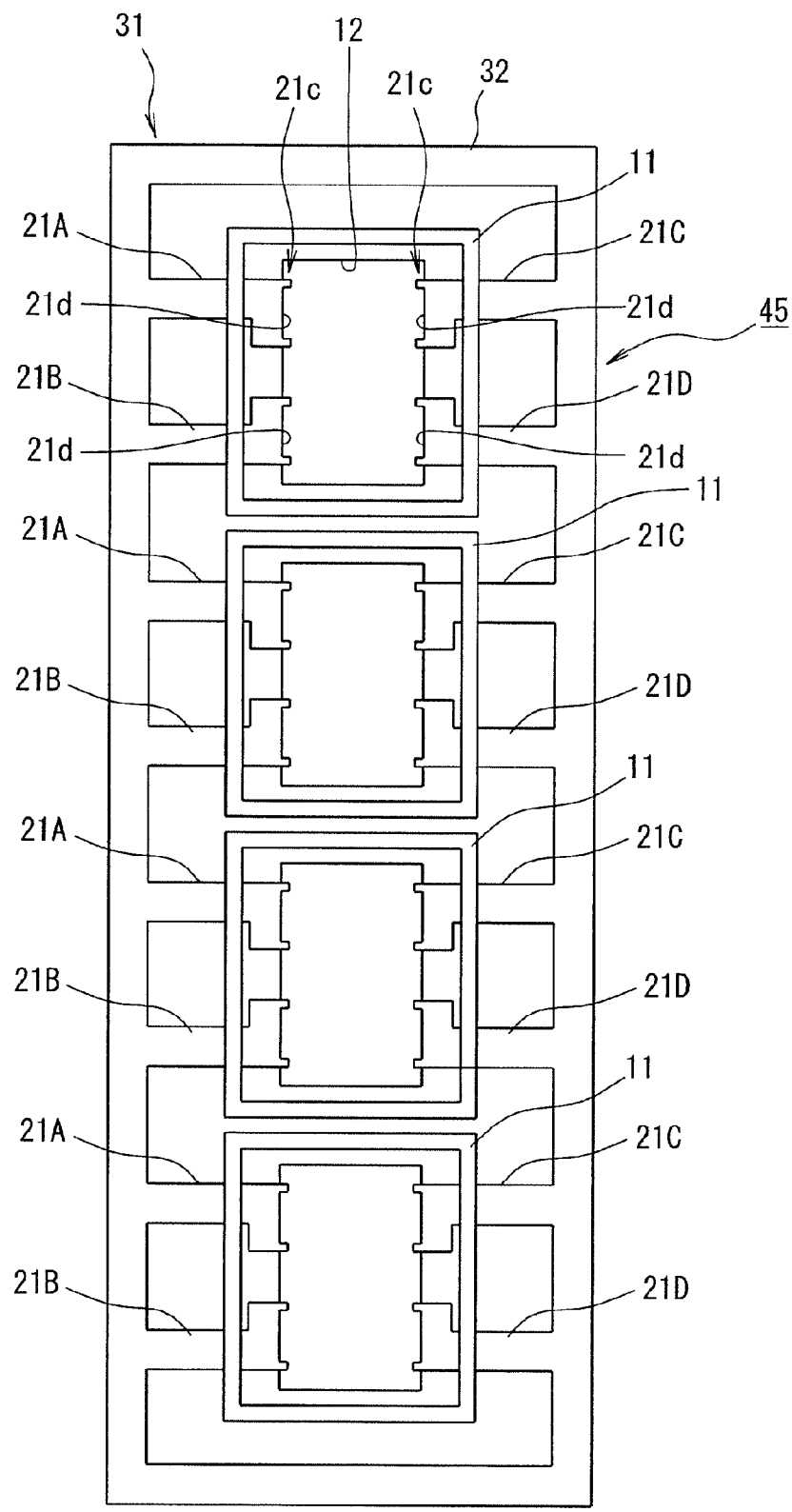
FIG. 7 is a plan view showing an insert-molded resin casing according to the embodiment of the invention.

FIG. 7 shows a plan view of a resin casing aggregate 45 formed by insert molding. Resin casings 11 are coupled to a tie-bar 32.

Figure 8:
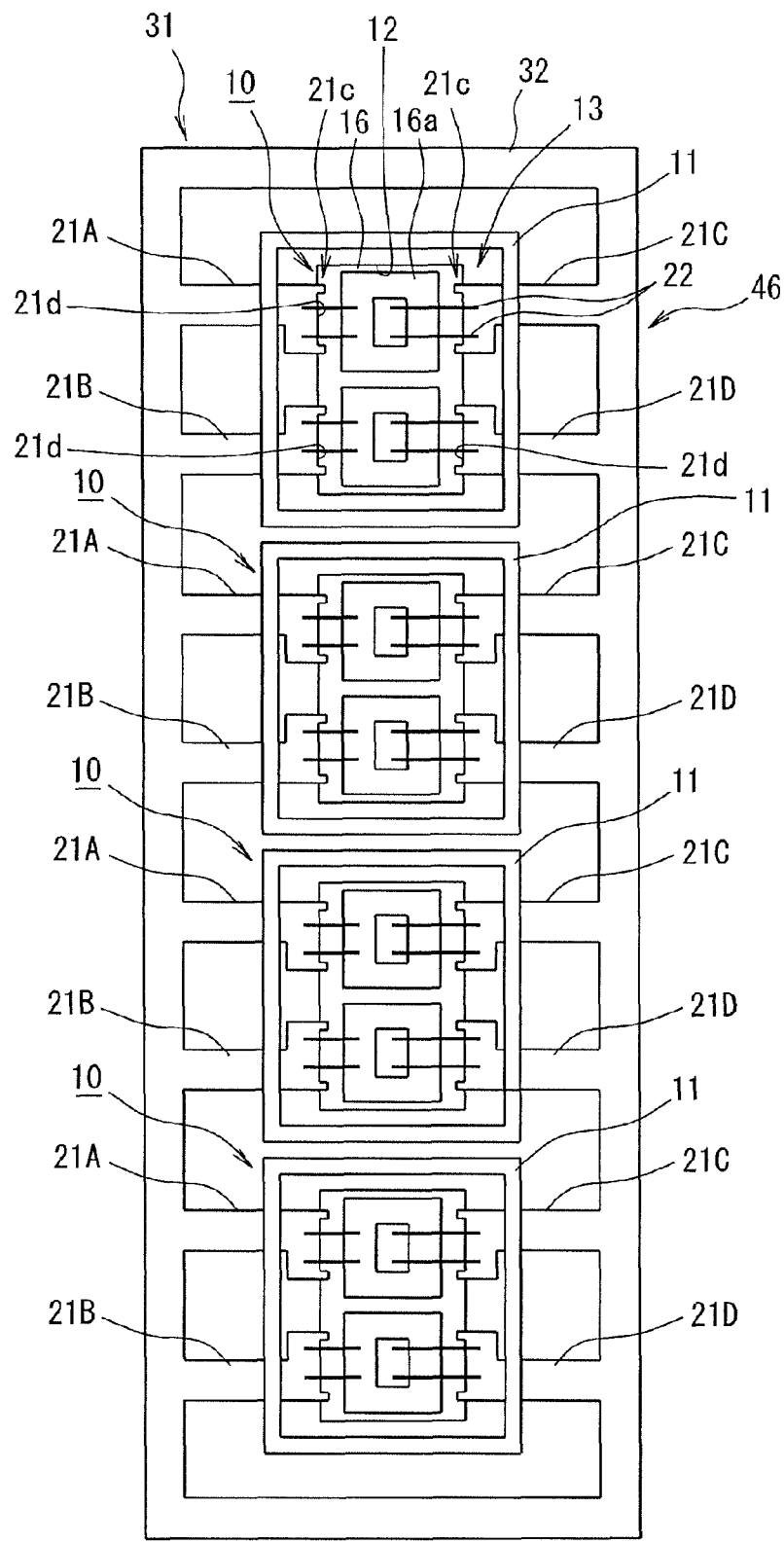
FIG. 8 is a plan view showing a semiconductor device aggregate according to the embodiment of the invention.

FIG. 8 shows a plan view of a semiconductor device aggregate 46. In each of the resin casings 11 constituting the resin casing aggregate 45 shown in FIG. 7, the insulating substrate 16 mounted with the semiconductor elements 15 is fitted into the notch portion 12a of the opening portion 12 so that the surface of the insulating substrate 16 on which the semiconductor elements 15 are mounted is received inside the opening portion 12 of the resin casing 11.

Incidentally, the resin casing 11 and the insulating substrate 16 are adhesively bonded to each other by an adhesive agent.

In the resin casing aggregate 45 into which the substrates 16 are fitted, bonding wires 22 are bonded insulating to predetermined places by a wire bonding device.

When the tie-bar 32 of the lead frame 31 of the semiconductor device aggregate 46 is then cut off, four semiconductor devices 10 are formed.

Incidentally, the tie-bar 32 of the lead frame 31 may be cut off before the bonding wires 22 are bonded.

In addition, after the bonding wires 22 are bonded, the opening portion 12, the lead terminal insertion face 13, and the rectangular frame-like portion 14 of the resin casing 11 are resin-sealed by a not-shown insulation resin such as an epoxy-based casting resin, a gel sealing agent, or the like.

According to the aforementioned method for manufacturing the semiconductor device, it is not necessary to cut off the clamp portions 21c protruding into the opening portion 12 of the resin casing 11 after the insert molding. Accordingly, it is possible to suppress stress applied to the bonding portions 21a of the lead terminals 21A to 21D of the resin casing 11 so that it is possible to suppress deformation of the bonding portions 21a. In addition, it is possible to prevent a gap from being generated between the bonding portions 21a of the lead terminals 21A to 21D and the resin layer 11a of the resin casing 11 by the stress applied during the cutting.

Accordingly, it is possible to firmly bond the bonding wires 22 to the bonding portions 21a without separation. Thus, it is possible to mold the resin casing 11 with excellent wire bonding properties so that it is possible to improve reliability of the semiconductor device 10 such as vibration test resistance, heat cycle resistance, etc.

In addition, as illustrated by the broken line in FIG. 3, it is necessary to increase the heights of the bonding wires 22 in order to secure insulation distances between the lead terminals 21A to 21D and the bonding wires 22 in the state in which the clamp portions 21c of the lead terminals 21A to 21D protrude into the opening portion 12. However, according to the embodiment of the invention, the concave notch portions 21d are formed in the clamp portions 21c in positions opposed to the bonding wires 22. Accordingly, the place where each of the bonding wires 22 passes can be lowered by a height corresponding to the concave notch portion 21d as illustrated by the solid line in FIG. 3 so that height of the semiconductor device 10 can be reduced.

The embodiment of the invention has been described in the case where the concave notch portions 21d are formed in the center portions of the clamp portions 21c of the lead terminals 21A to 21D and the clamp protrusions 21e and 21f are formed on the opposite sides of the notch portions 21d as shown in FIG. 2. However, the invention is not limited to the aforementioned configuration.

As shown in FIG. 4A, notch portions 21h and 21i may be formed in opposite end surfaces of the bonding portion 21a of each of the lead terminals 21A to 21D parallel to the perpendicular direction to the inner end surface of the opening portion 12 of the resin casing 11 and a convex clamp protrusion 21g may be formed in the center portion of the bonding portion 21a in the case where the bonding wires 22 pass above the opposite end surfaces of the bonding portion 21a parallel to the perpendicular direction to the inner end surface of the opening portion 12 of the resin casing 11.

In addition, as shown in FIG. 4B, a notch portion 21k may be formed on one end surface of the bonding portion 21a of each of the lead terminals 21A to 21D above which the bonding wires 22 pass and a clamp protrusion 21j may be provided in the other end surface of the bonding portion 21a in the case where the bonding wires 22 pass above the one end surface of the bonding portion 21a parallel to the perpendicular direction to the inner end surface of the opening portion 12 of the resin casing 11.

On this occasion, a protrusion length L3 and a width W4 of each of the clamp protrusions 21g (or 21j) are set to be not smaller than the thickness t of each of the lead terminals 21A to 21D. Thus, clamping using the lower mold 41 and the upper mold 42 for insert molding which will be described later can be performed surely.

Accordingly, it is possible to firmly bond the bonding wires 22 to the bonding portions 21a without separation. Thus, it is possible to mold the resin casing 11 with excellent wire bonding properties so that it is possible to improve reliability of the semiconductor device 10 such as vibration test resistance, heat cycle resistance, etc.

Incidentally, the number of bonding wires 22 may be one. The number of bonding wires 22 to be bonded is set according to the necessity such as a withstand voltage, an intended purpose of the semiconductor device, etc.

Further, although the embodiment has been described in the case where four semiconductor devices 10 are formed by insert molding simultaneously, the invention is not limited thereto. The number of semiconductor devices formed simultaneously by insert molding may be set to be any desired number in accordance with the specifications of the molds.

Figure 9:
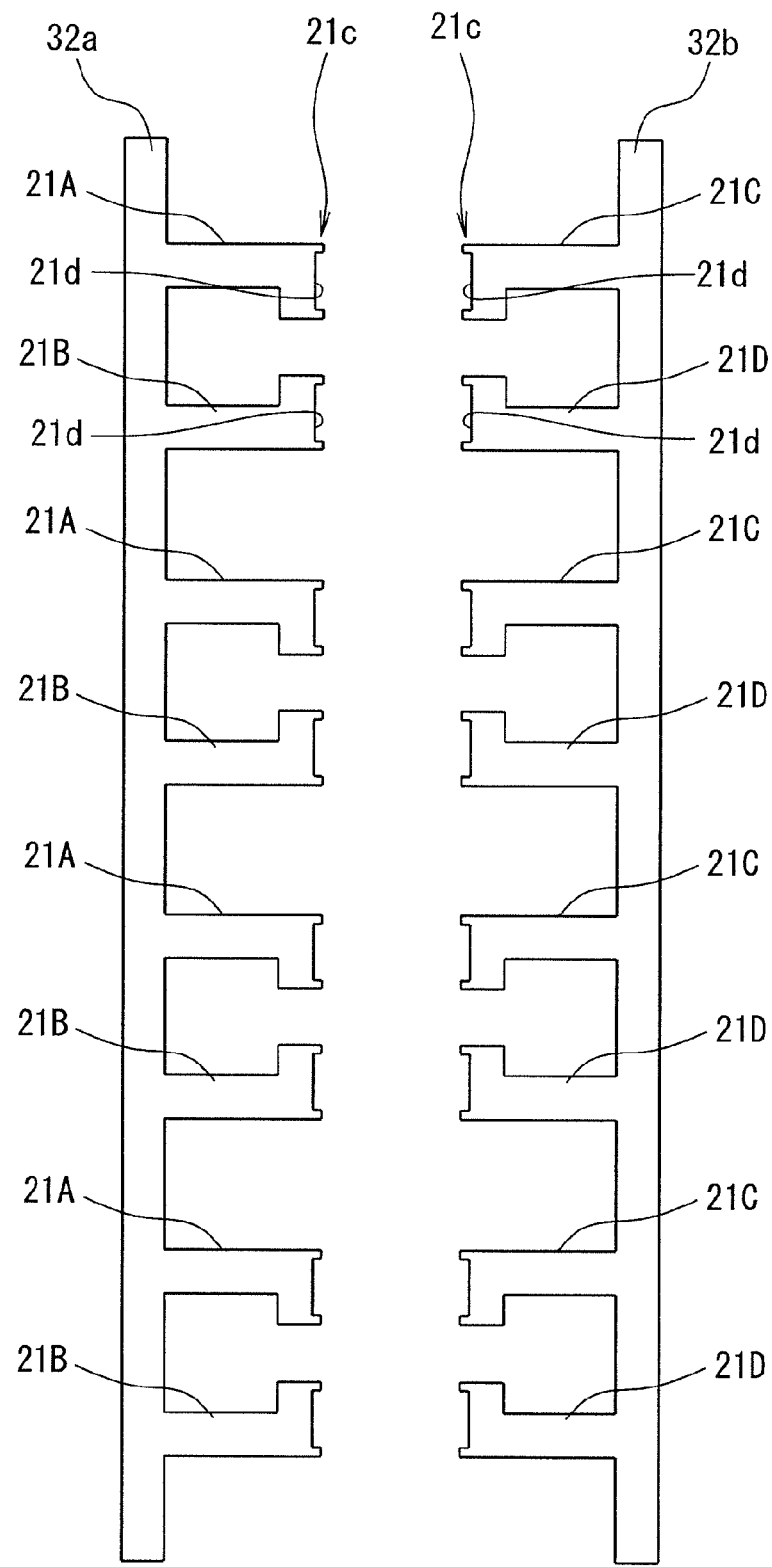
FIG. 9 is a plan view showing a lead frame according to the embodiment of the invention.

FIG. 9 is a plan view showing a lead frame 31.

Although the embodiment has been described in the case where the tie-bar 32 constituting the lead frame 31 is formed into a rectangular frame shape, the invention is not limited thereto. As shown in FIG. 9, configuration may be made in such a manner that front and rear frame parts of a tie-bar 32 are separated so that the lead terminals 21A and 21B and the lead terminals 21C and 21D are coupled to different tie-bar parts 32a and 32b respectively.

Embodiment 3

A semiconductor device according to another embodiment of the invention will be described.

Figure 10:
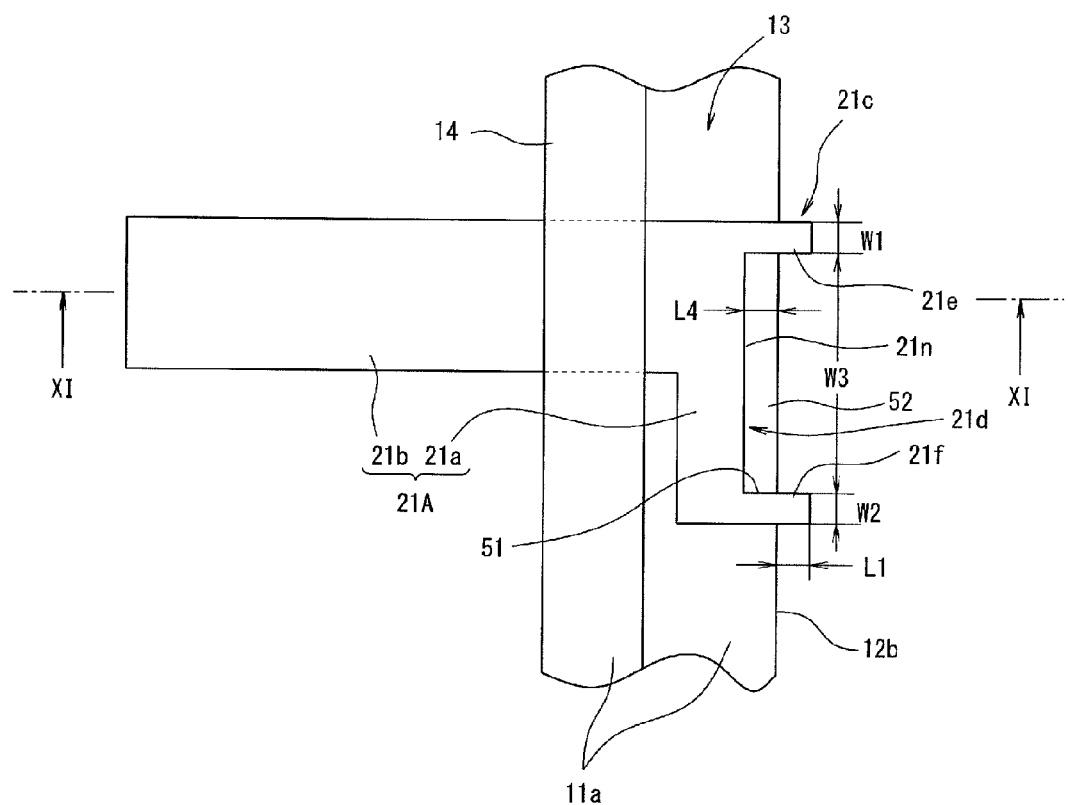
FIG. 10 is an enlarged plan view corresponding to FIG. 2 according to an embodiment of the invention.
Figure 11:
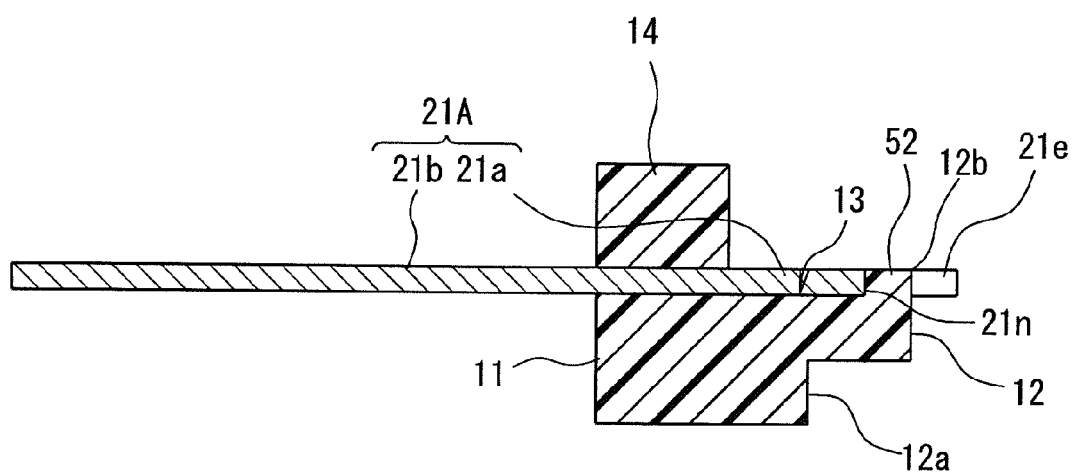
FIG. 11 is a sectional view taken along the line XI-XI of FIG. 10.

FIG. 10 shows an enlarged plan view corresponding to FIG. 2 in Embodiment 1. FIG. 11 shows a sectional view taken along the line XI-XI of FIG. 10.

The embodiment has the same configuration as Embodiment 1 except that the shape of the notch portion 21d in each of the lead terminals 21A to 21D in the aforementioned Embodiment 1 is changed. Similar components to those in FIG. 2 are referred to by the same numerals correspondingly and detailed description thereof will be omitted here.

In the embodiment, the shape of the notch portion 21d formed in the bonding portion 21a of each of the lead terminals 21A to 21D is changed as shown in FIG. 10. That is, a bottom portion 21n of the notch portion 21d is formed in a position to be set back toward the outside from the end edge 12b of the opening portion 12 by a distance L4.

In this manner, the bottom portion 21n of the notch portion 21d is set back from the end edge 12b of the opening portion 12 by the distance L4. Therefore, a rectangular resin injection space 51 is formed between the bottom portion 21n and the end edge 12b of the opening portion 12, as shown in FIG. 10. When the resin casing 11 is insert-molded by injection of a resin material composed of polyphenylene sulfide (PPS), polybutylene succinate (PBT), etc. as described above, the resin material can enter the resin injection space 51 to form a resin protrusion layer 52.

Here, the distance L4 between the bottom portion 21n of the notch portion 21d and the end edge 12b of the opening portion 12 is set to be not smaller than the thickness t (for example, 0.5 mm) of each of the lead terminals 21A to 21D in order to prevent the resin protrusion layer 52 from collapsing.

When the resin casing 11 is insert-molded in the method for manufacturing the semiconductor device in the aforementioned Embodiment 3, the resin material is injected into the resin injection space 51 of the notch portion 21d formed in the bonding portion 21a of each of the lead terminals 21A to 21D so that the resin protrusion layer 52 is formed, as apparent in FIG. 11.

That is, in the resin injecting step, the resin material which is composed of polyphenylene sulfide (PPS), polybutylene succinate (PBT), etc. and which has been melted by heat is injected into the cavities 41a and 42a of the lower mold 41 and the upper mold 42 with predetermined pressure and solidified in the state in which the clamp protrusions 21e and 21f of the clamp portion 21c are clamped by the lower mold 41 and the upper mold 42. In this manner, the resin material is injected into the resin injection space 51 of the notch portion 21d. Accordingly, the resin material is solidified to form the resin protrusion layer 52 between the bottom portion 21n of the notch portion 21d and the end edge 12b of the opening portion 12, as shown in FIG. 11.

Accordingly, as shown in FIG. 10, the bonding portion 21a of the lead terminal 21A is sandwiched from four sides, i.e. from the front and rear side surfaces and the left side surface of the resin layer 11a in the same manner as in the aforementioned Embodiment 1 and from the resin protrusion layer 52, during curing and contraction of the resin material after the insert molding. Therefore, it is possible to firmly bond the bonding portion 21a of the lead terminal to the resin casing 11 without separation so that it is possible to mold the resin casing 11 with excellent wire bonding properties. In this manner, it is possible to improve reliability of the semiconductor device 10 such as vibration test resistance, heat cycle resistance, etc. more greatly. In addition thereto, the notch portion 21d and the resin protrusion layer 52 are formed under the bonding wires 22. Accordingly, it is possible to reduce the height of each of the bonding wires 22 more greatly while securing the insulation distance between the lead terminal and the bonding wire 22 sufficiently.

Moreover, even if each of the lead terminals 21A to 21D is thin to be smaller than 0.5 mm in plate thickness t, the lead terminals 21A to 21D still can be fixed in accurate positions due to the provision of the clamp portions 21c including the concave notch portions 21d with the aforementioned dimensions in the lead terminals 21A to 21D. Thus, it is possible to form the resin casing 11 in which the bonding portions 21a of the lead terminals 21A to 21D are not deformed.

Further, the distance L4 as the width of the resin protrusion layer 52 is set to be not smaller than the thickness t of each of the lead terminals 21A to 21D. Accordingly, it is possible to surely prevent the resin protrusion layer 52 from collapsing when the bonding wires are bonded by a wire bonding device after the insert molding.

The embodiment of the invention has been described in the case where the concave notch portion 21d is formed in the center portion of the clamp portion 21c of each of the lead terminals 21A to 21D and the clamp protrusions 21e and 21f are formed on the opposite sides of the notch portion 21d as shown in FIG. 10. However, the invention is not limited to the aforementioned configuration.

Figure 12:
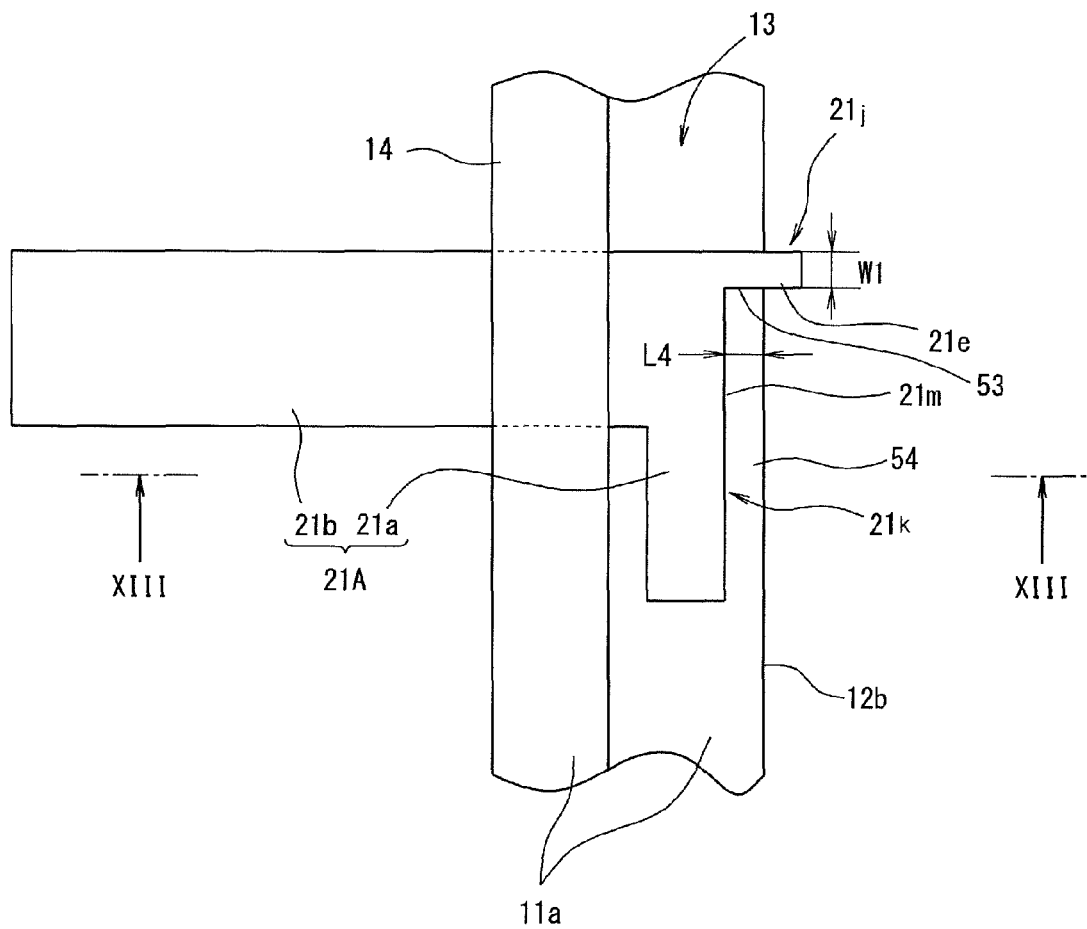
FIG. 12 is an enlarged plan view corresponding to FIG. 2 according to the embodiment of the invention.
Figure 13:
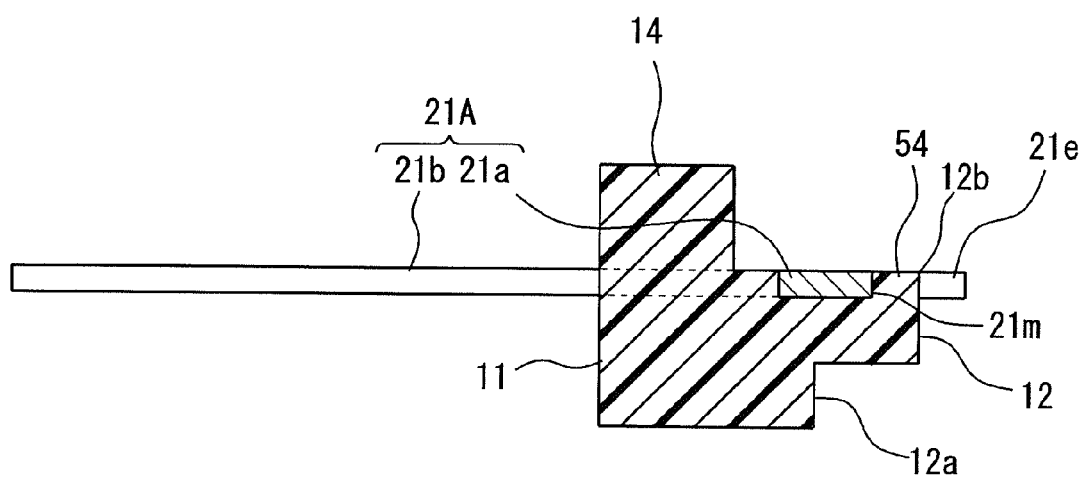
FIG. 13 is a sectional view taken along the line XIII-XIII of FIG. 12.

As shown in FIG. 12 and FIG. 13, a notch portion 21k may be formed in one end surface of the bonding portion 21a of each of the lead terminals 21A to 21D above which the bonding wires 22 pass and a clamp protrusion 21j may be provided in the other end surface of the bonding portion 21a when the bonding wires 22 pass above the one end surface of the bonding portion 21a parallel to the perpendicular direction to the inner end surface of the opening portion 12 of the resin casing 11. In this case, a bottom portion 21m of the notch portion 21k may be set back toward the outside from the end edge 12b of the opening portion 12 to form a resin injection space 53 so that a resin protrusion layer 54 can be formed.

Figure 14:
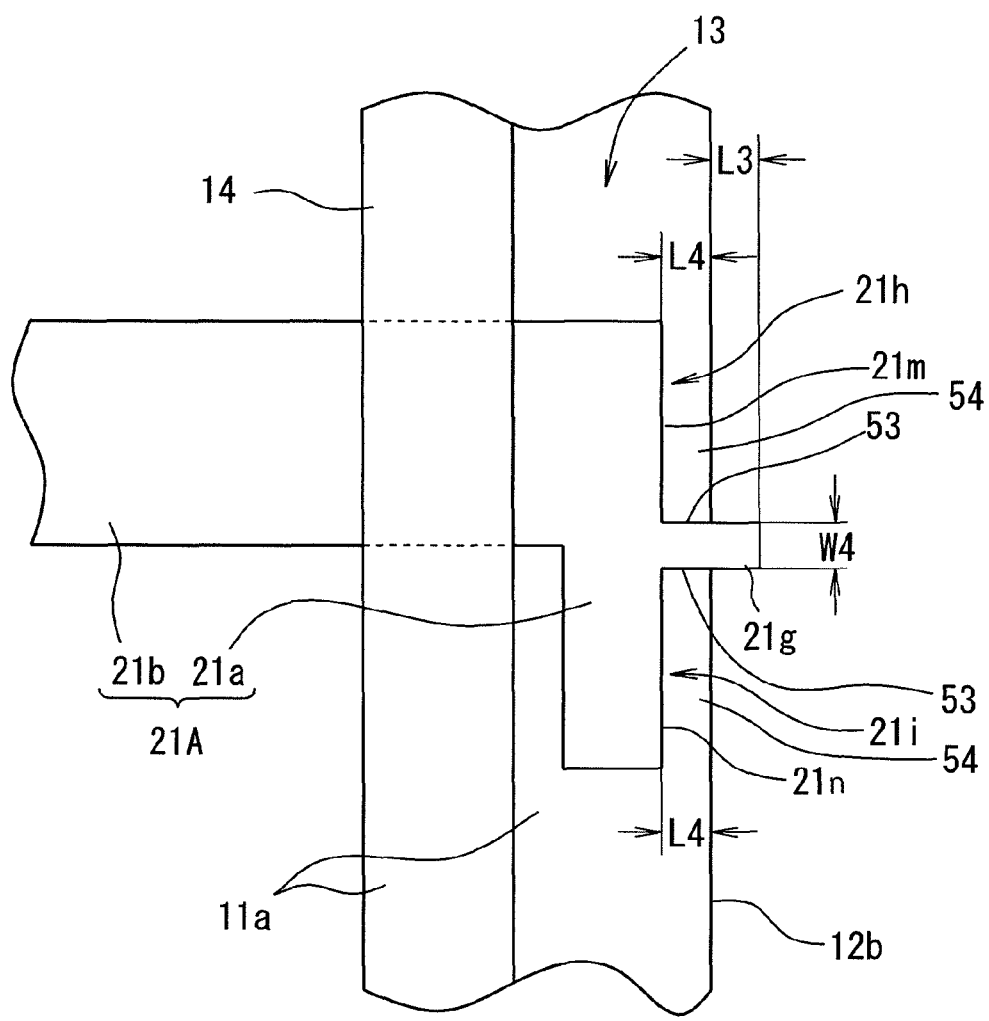
FIG. 14 is an enlarged plan view corresponding to FIG. 2 according to the embodiment of the invention.

Further, as shown in FIG. 14, notch portions 21h and 21i may be formed in opposite end surfaces of the bonding portion 21a of each of the lead terminals 21A to 21D parallel to the perpendicular direction to the inner end surface of the opening portion 12 of the resin casing 11 and a convex clamp protrusion 21g may be provided in the center portion of the bonding portion 21a when the bonding wires 22 pass above the opposite end surfaces of the bonding portion 21a parallel to the perpendicular direction to the inner end surface of the opening portion 12 of the resin casing 11. Also in this case, bottom portions 21m and 21n of the notch portions 21h and 21i may be set back toward the outside from the end edge 12b of the opening portion 12 to form resin injection spaces 53 so that resin protrusion layers 54 can be formed.

Incidentally, although the embodiment has been described in the case where each of the bottom portions 21m and 21n of the notch portions 21h and 21i is formed into a linear shape parallel to the end edge 12b of the opening portion 12, the shape of each of the bottom portions 21m and 21n is not limited thereto but may be formed as any desired shape such as a wavy shape, a curved shape, a polygonal line shape.

In addition, although the embodiment has been described in the case where each of the lead terminals 21A to 21D is formed into an L shape, the shape of each of the lead terminals 21A to 21D is not limited thereto but may be formed as a linear shape or as a T shape or may be formed as any desired shape.

It will be apparent to one skilled in the art that the manner of making and using the claimed invention has been adequately disclosed in the above-written description of the exemplary embodiments taken together with the drawings. Furthermore, the foregoing description of the embodiments according to the invention is provided for illustration only, and not for limiting the invention as defined by the appended claims and their equivalents.

It will be understood that the above description of the exemplary embodiments of the invention are susceptible to various modifications, changes and adaptations, and the same are intended to be comprehended within the meaning and range of equivalents of the appended claims.

What is claimed is:

1. A semiconductor device including a semiconductor element received in an annular resin casing which has an opening portion and which is molded integrally with lead terminals by insert molding, the semiconductor device comprising:
   the lead terminals each of which is provided with a bonding portion and a terminal portion;
   the resin casing which is formed by the insert molding, while clamp portions having clamp protrusions formed in the bonding portions of the lead terminals are put between molds opposed to each other in a state in which the clamp portions are protruded into the opening portion;
   an insulating substrate which has a wiring pattern mounted with the semiconductor element disposed in the opening portion; and
   bonding wires which make electric connection between the semiconductor element and one of the bonding portions of the lead terminals and between the wiring pattern on the insulating substrate and another of the bonding portions of the lead terminals; wherein:
   the clamp portions are provided with notch portions.

2. The semiconductor device according to claim 1, wherein:
   the notch portions are provided in positions to which the bonding wires making electric connection between the bonding portions of the lead terminals and at least one of the semiconductor element and the wiring pattern on the insulating substrate are opposed.

3. The semiconductor device according to claim 2, wherein:
   the notch portions are provided in centers of the clamp portions and the clamp protrusions are formed on opposite sides of the notch portions.

4. The semiconductor device according to claim 2, wherein:
   the notch portions are provided so that the clamp protrusions are left in center portions of the clamp portions.

5. The semiconductor device according to claim 2, wherein:
   the notch portions are provided so that the clamp protrusions are left in one of end portions of the clamp portions parallel to a perpendicular direction to an end surface of the opening portion of the resin casing.

6. The semiconductor device according to claim 2, wherein:
   the notch portions are formed so that bottom portions of the notch portions align with an end edge of the opening portion.

7. The semiconductor device according to claim 2, wherein:
   resin injection spaces are formed between the bottom portions of the notch portions and an end edge of the opening portion in the notch portions so that a resin material forming the resin casing can enter the resin injection spaces to form resin protrusion layers.

8. The semiconductor device according to claim 2, wherein:
   the notch portions are formed so that a width of each of the clamp protrusions of the clamp portions in a parallel direction to an end surface of the opening portion of the resin casing is not smaller than a thickness of each of the lead terminals.

9. The semiconductor device according to claim 1, wherein:
   the notch portions are formed so that bottom portions of the notch portions align with an end edge of the opening portion.

10. The semiconductor device according to claim 1, wherein:
    resin injection spaces are formed between the bottom portions of the notch portions and an end edge of the opening portion in the notch portions so that a resin material forming the resin casing can enter the resin injection spaces to form resin protrusion layers.

11. The semiconductor device according to claim 1, wherein:
    a length with which each of the clamp protrusions of the clamp portions protrudes into the opening portion of the resin casing is not smaller than a thickness of each of the lead terminals.

12. The semiconductor device according to claim 1, wherein:
    the notch portions are formed so that a width of each of the clamp protrusions of the clamp portions in a parallel direction to an end surface of the opening portion of the resin casing is not smaller than a thickness of each of the lead terminals.

* * * * *